US005994238A

United States Patent [19]
Park

[11] Patent Number: 5,994,238
[45] Date of Patent: *Nov. 30, 1999

[54] METHOD FOR FABRICATING SEMICONDUCTOR DEVICE WITH CONTROL OF OXIDE TO SILICON ETCHING SELECTIVITY

[75] Inventor: Chang Seo Park, Ichon, Rep. of Korea

[73] Assignee: Hyundai Electronics Industries Co., Ltd., Kyoungki, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/769,520

[22] Filed: Dec. 19, 1996

[30] Foreign Application Priority Data

Dec. 29, 1995 [KR] Rep. of Korea ............... 95-66018

[51] Int. Cl.$^6$ .................................................. H01L 21/302
[52] U.S. Cl. .................................. 438/738; 438/743
[58] Field of Search ............................. 438/738, 740, 438/743

[56] References Cited

U.S. PATENT DOCUMENTS

| | | | |
|---|---|---|---|
| 4,127,437 | 11/1978 | Bersin et al. | 437/743 |
| 4,498,953 | 2/1985 | Cook et al. | 438/738 |
| 4,502,915 | 3/1985 | Carter et al. | 438/738 |
| 4,615,764 | 10/1986 | Bobbio et al. | 438/738 |
| 4,749,440 | 6/1988 | Blackwood et al. | 438/743 |
| 4,789,426 | 12/1988 | Pipkin | 438/738 |
| 5,073,232 | 12/1991 | Ohmi et al. | 438/706 |
| 5,279,705 | 1/1994 | Tanaka | 438/738 |
| 5,342,808 | 8/1994 | Brigham et al. | 437/228 |
| 5,346,586 | 9/1994 | Keller | 438/738 |
| 5,376,233 | 12/1994 | Man | 437/738 |
| 5,393,708 | 2/1995 | Hsia et al. | 437/228 |
| 5,423,944 | 6/1995 | Wong | 438/719 |
| 5,505,816 | 4/1996 | Barnes et al. | 438/738 |
| 5,567,332 | 10/1996 | Mehta | 438/743 |
| 5,726,100 | 3/1998 | Givens | 438/702 |
| 5,783,496 | 7/1998 | Flanner et al. | 438/743 |
| 5,827,437 | 10/1998 | Yang et al. | 216/77 |
| 5,868,855 | 2/1999 | Fukazawa et al. | 134/1.3 |

FOREIGN PATENT DOCUMENTS

| | | |
|---|---|---|
| 89-94624 | 4/1989 | Japan . |
| 94-168922 | 6/1994 | Japan . |
| 95-142443 | 6/1995 | Japan . |

*Primary Examiner*—Bruce Breneman
*Assistant Examiner*—Anita Alanko
*Attorney, Agent, or Firm*—Thelen Reid & Priest, LLP

[57] ABSTRACT

A method for fabricating a semiconductor device is characterized by using a mixture chemical comprising ozone gas, anhydrous HF gas and deionized water vapor as an etchant for etching an oxide- and silicon-exposed wafer, whereby the etch selection ratio of oxide to silicon can be controlled according to necessity, so that the production yield and reliability of semiconductor device are improved. During etching of a wafer with exposed thermal oxide and exposed silicon, the etch rate ratio of oxide to silicon is controlled by changing the relative flow rates of the ozone gas, anhydrous HF gas and deionized water vapor.

4 Claims, 2 Drawing Sheets

METHOD FOR FABRICATING SEMICONDUCTOR DEVICE WITH CONTROL OF OXIDE TO SILICON ETCHING SELECTIVITY

BACKGROUND OF THE INVENTION

1. Field of the Invention

The present invention relates, in general, to a method for fabricating a semiconductor device and, more particularly, to use of a mixture phase of ozone gas, anhydrous HF gas and deionized water vapor to control the etch selection ratio between oxide film and polysilicon film.

2. Description of the Prior Art

To etch an oxide film, fluorine compounds are typically used as etchants. For example, an aqueous HF or BOE solution is employed in a wet etch process while $CF_4CHF_3$ is used in a dry etch (plasma) process.

For polysilicon film, a mix aqueous solution of fluoric acid, acetic acid and nitric acid may serve as an etchant in a wet etch process. Plasma dry etch is also utilized for polysilicon film.

These conventional techniques are highly selective between oxide film and silicon film. That is, during the etching of an oxide film with such etchants as are used in the conventional techniques, a silicon film is little etched and vice versa.

With such fluorine chemicals, low or similar etch selection ratios are difficult to obtain. Thus, when an oxide or silicon film is needed to a certain extent, a composition suitable to moderately etch them cannot be achieved with such fluorine chemicals.

SUMMARY OF THE INVENTION

Therefore, it is an objective of the present invention to overcome the above problems encountered in prior arts and to provide a method for fabricating a semiconductor by which the etch selection ratio between oxide film and silicon film can be adjusted into low values with only a low volume of the oxide and silicon films.

In accordance with the present invention, the above objective could be accomplished by a provision of a method for fabricating a semiconductor device, which comprise use of a mixture of ozone gas, anhydrous HF gas and deionized water vapor as an etchant for etching a wafer on which oxide and silicon are exposed, whereby the etch selection ratio between the oxide and the silicon can be adjusted by changing the relative flow rates of the etchants.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENT

When a silicon film including polysilicon and amorphous silicon is etched with a mixture chemical comprising ozone gas, anhydrous HF gas and deionized water vapor, the ozone gas oxidizes the silicon to grow an oxide film thereon which is, in turn, etched by the anhydrous HF gas and deionized water vapor. Ultimately, the silicon film is etched.

Of the mixture chemical, ozone gas has a great influence on the oxidation of silicon film. Although the deionized water vapor gives a contribution to the oxidation of the silicon film, it is negligible in comparison to that obtainable with HF. However, even a small amount of deionized water vapor can etch the silicon oxide at a rapid rate. In fact, the oxide ($SiO_2$) grown on silicon is greatly affected by the concentration of the deionized water vapor in the mixture chemical. On the other hand, in the absence of deionized water vapor, anhydrous HF gas alone cannot etch the oxide film, so that a thin silicon oxide remains formed on the silicon surface, preventing the oxygen of the ozone gas from penetrating into the silicon. Thus, the oxide cannot grow further, resulting in no loss of the silicon. When a silicon wafer is treated with the mixture chemical at room temperature under the atmospheric pressure, the above result is obtained. But, in a controlled atmosphere, the oxide can further grow on the silicon.

When an oxide film is etched using the mixture chemical, the ozone gas has no influence on the etch rate of the remainder, the anhydrous HF gas and deionized water vapor. Where an oxide in which excess silicon exists is etched with the mixture chemical, HF gas effects poor etch uniformity, which can however be prevented by the oxidation reaction attributed to the ozone gas.

In etching an oxide with the mixture chemical, the etch rate is greatly dependent on the concentration of the deionized water vapor. This will be described in conjunction with the drawings.

Figure 1A:
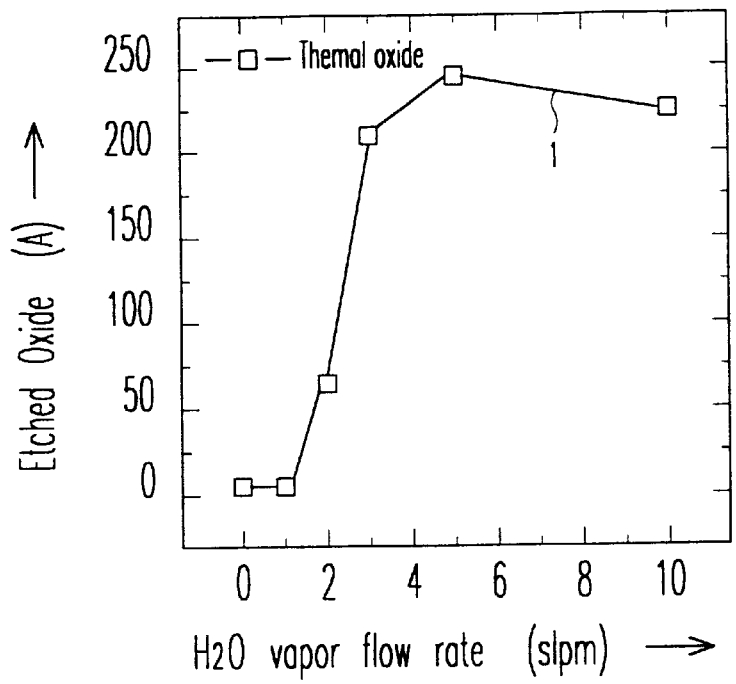
FIGS. 1A through 1D shows the changes of oxide etch rate with the concentration of deionized water vapor in the mixture chemical according to the present invention.
Figure 1B:
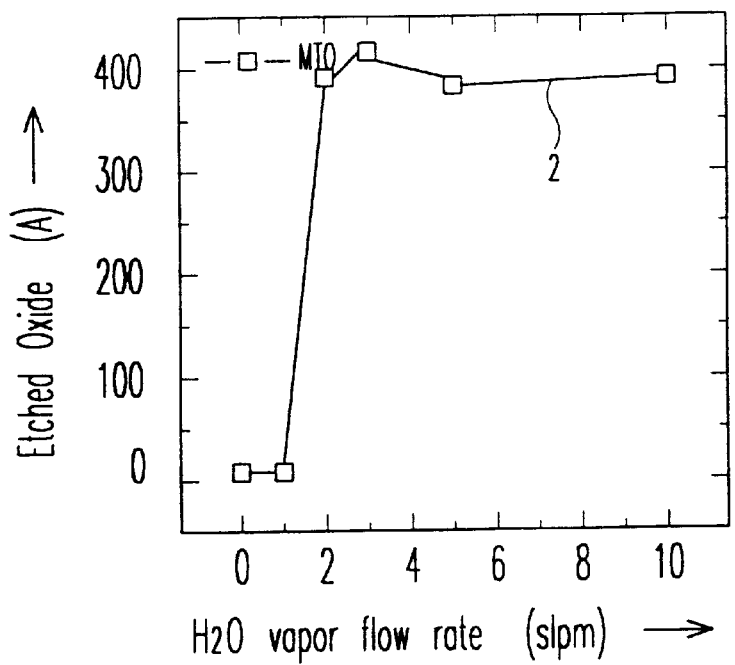

Referring to FIGS. 1A and 1B, etch rates for thermal oxide (1) and undoped oxide (2) are plotted with regard to the concentration of deionized water vapor, respectively. As seen in these plots, the etch rates stay at zero when deionized water vapor is absent or in a trace amount. However, the etch rate for the oxide films increase rapidly with the amount of deionized water vapor.

Figure 1C:
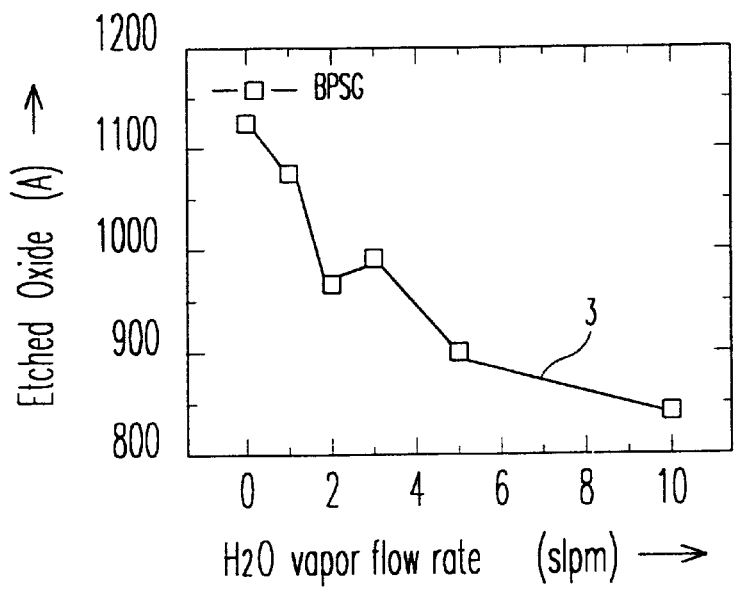
Figure 1D:
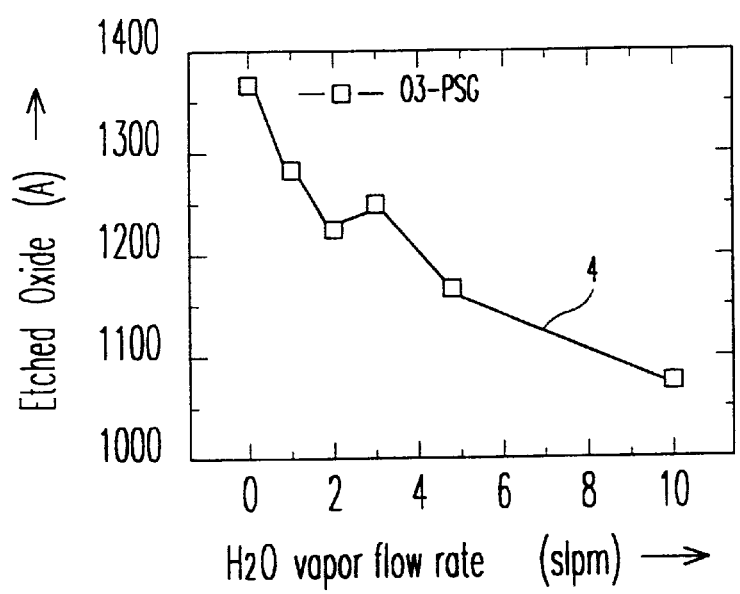

For doped oxide (3,4), high etch rate can be obtained when no or little deionized water vapor is introduced because the doped oxide absorbs moisture from the air. In contrast to the thermal oxide and undoped oxide, BPSG and PSG, doped oxides, are etched slowly as deionized water vapor increases, as shown in FIGS. 1C and 1D.

As for the etch selection between oxide and silicon, the concentration of the mixture chemical plays a critical role in determining it. The conventional wet etchants, such as fluoric acid solution and mixture of fluoric acid, acetic acid and nitric acid, and dry etchants, such as HF gas, $CCl_4$, $CF_4$, $CHF_3$ and etc, alone cannot allow desired etch selection ratio, if generated, between oxide and silicon owing to a difference in the composition of etchant.

Detailed etch selections obtainable with the conventional etchants are given below.

First, when oxide and silicon are etched using an aqueous HF solution (HF:$H_2O$ 50:1), silicon is by no means etched as suggested in Table 1 below.

TABLE 1

| Amounts etched with aqueous HF solution | | | |
| --- | --- | --- | --- |
| | Dip Time | | |
| Material | 100 Sec | 500 Sec | 1,000 Sec |
| Thermal Oxide | 105 Å | 545 Å | 992 Å |
| Silicon | 0 | 0 | 0 |

Using BOE solution ($NH_4$:HF 9:1), silicon can be etched but at a little amount. Thus, it is virtually impossible to control etch selection with BOE solution, as shown in Table 2 below.

TABLE 2

Amounts etched with BOE solution

| | Dip Time | | |
|---|---|---|---|
| Material | 10 Sec | 30 Sec | 60 Sec |
| PECVD Oxide (BPSG) | 103 Å | 385 Å | 738 Å |
| Thermal Oxide | 97 Å | 318 Å | 625 Å |
| Silicon | 2 Å | 3 Å | 11 Å |

When dry etch is executed with plasma, silicon and thermal oxide are removed at an amount of, for example, about 4,000 Angstrom and about 200 Angstrom, respectively, for 1 min. Depending on the conditions of etchant, the etch selection ratio of oxide to silicon ranges from 20:1 to 60:1 at little etch amount. As thick as 50,000 Angstrom of silicon is necessary to lower the etch selection ration into 1:1.

In the conventional wet etch or plasma etch, the etch selection ratio is restricted as mentioned. In particular, when the etch amount is low, the etch selection ratio cannot be controlled because of the conventional etchant's composition.

In contrast, the mixture chemical according to the present invention allows oxide and silicon to be etched at a controlled etch selection ratio. An oxide-exposed and silicon-exposed wafer is etched in a first etching step with a first concentration of a mixture chemical comprising ozone gas, anhydrous hydrogen fluoride gas and deionized water vapor. In a further etching step, a second concentration of said mixture chemical is used such that it is not provided with further deionized water vapor but is provided with an increased amount of said anhydrous HF gas so that silicon but no oxide is etched.

For example, when thermal oxide and silicon were etched using a chemical comprising a composition of 1–5 lpm of ozone gas, 50–300 sccm of anhydrous HF and 0 lpm of deionized water vapor, thermal oxide is not etched but polysilicon or amorphous silicon was removed at an amount of 300–2,000 Angstrom as the amount of anhydrous HF gas increased. In this case, the etch selection ratio of the thermal oxide to the poly silicon or amorphous silicon was obtained in a range of 1:300 to 1:∞.

When thermal oxidation was carried out in an atmosphere comprising 1–5 lpm of ozone gas, 150 sccm of anhydrous HF gas and 5 lpm of deionized water vapor, the oxide was etched at a rate of about 11 Å/sec while about an etch rate of 17 Å/sec was obtained for polysilicon, resulting in an etch selection ratio of 1:1.5–1:2.

When a composition comprising 1–5 lpm of ozone gas, 250–300 sccm of anhydrous and 10 lpm of deionized water vapor is used for thermal oxidation, the thermal oxide is etched at a rate of about 45 Å/sec while polysilicon is removed at an etch rate of about 46–50 Å/sec. This is about 1:1 in terms of etch selection ratio.

As described hereinbefore, the etch selection ratio of oxide to silicon can be controlled in a range of 1:1 to 1:∞ by the mixture of chemical comprising ozone gas, anhydrous HF gas and deionized water vapor according to the present invention.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for fabricating a semiconductor device comprising: a first step of etching an oxide- and silicon-exposed wafer with a mixture chemical comprising ozone gas, anhydrous HF gas and deionized water vapor, whereby the etch selection ratio of oxide to silicon is controlled by changing the relative flow rates of the mixture chemical; and a further etching step wherein said mixture chemical is not provided with further deionized water vapor but is provided with an increased amount of said anhydrous HF gas so that silicon but no oxide is etched.

2. The method of claim 1, wherein said wafer is a thermal oxide- and polysilicon-exposed wafer and wherein said first etching step or said further etching step is carried out in an atmosphere comprising 1–5 lpm of ozone gas, 150 sccm of anhydrous HF gas and 5 lpm of deionized water vapor, wherein the oxide is etched at a rate of about 11 Å/sec and wherein the polysilicon is etched at a rate of about 17 Å/sec, resulting in an etch ratio of 1:1.5–1:2.

3. The method of claim 1, wherein said wafer is a thermal oxide- and polysilicon-exposed wafer and wherein said first etching step or said further etching step is carried out in an atmosphere comprising 1–5 lpm of ozone gas, 250–300 sccm of anhydrous HF gas and 10 lpm of deionized water vapor, wherein the oxide is etched at a rate of about 45 Å/sec and wherein the polysilicon is etched at a rate of about 46–50 Å/sec.

4. The method of claim 1, wherein said wafer is a thermal oxide- and silicon-exposed wafer and wherein said further etching step is carried out in an atmosphere comprising 1–5 lpm of ozone gas, 50–300 sccm of anhydrous HF gas and 0 lpm of deionized water vapor.

* * * * *